United States Patent
Moriya

(10) Patent No.: US 8,225,493 B2
(45) Date of Patent: Jul. 24, 2012

(54) ELECTRONIC COMPONENT MOUNTING APPARATUS

(75) Inventor: Tatsuyuki Moriya, Chofu (JP)

(73) Assignee: Juki Corporation, Chofu-shi, Tokyo (JP)

( * ) Notice: Subject to any disclaimer, the term of this patent is extended or adjusted under 35 U.S.C. 154(b) by 413 days.

(21) Appl. No.: 12/550,030

(22) Filed: Aug. 28, 2009
(Under 37 CFR 1.47)

(65) Prior Publication Data

US 2010/0180434 A1 Jul. 22, 2010

(30) Foreign Application Priority Data

Aug. 29, 2008 (JP) ................................. 2008-220852
Aug. 24, 2009 (JP) ................................. 2009-193585

(51) Int. Cl.
*H05K 13/04* (2006.01)
*H05K 13/08* (2006.01)

(52) U.S. Cl. ............. 29/708; 29/739; 29/743; 700/117; 700/121

(58) Field of Classification Search .................... 29/708, 29/739–741, 743; 700/95, 117, 121
See application file for complete search history.

(56) References Cited

U.S. PATENT DOCUMENTS 7,409,253 B2 * 8/2008 Shimizu et al. ................. 700/96

FOREIGN PATENT DOCUMENTS

JP 2003-133800 5/2003
JP 2003133800 A * 5/2003

* cited by examiner

*Primary Examiner* — Livius R Cazan
(74) *Attorney, Agent, or Firm* — Drinker Biddle & Reath LLP

(57) ABSTRACT

Before a user starts the operation of an electronic component mounting apparatus, user's input representing as to whether the user is an operator, a programmer or a manager/maintenance person is accepted and further user level information representing degree of skill of the user as to the safety measures is accepted. The power supply of a mechanical portion operating a head portion is interrupted in accordance with the state of the apparatus including at least the user level information and the open/close state of a safety cover for covering the movable range of the head portion.

2 Claims, 12 Drawing Sheets

Fig. 6

| CAUSES FOR INTERRUPTING MAIN CIRCUIT | | | USER DIVISION | | |
|---|---|---|---|---|---|
| MAIN CAUSES | CONDITIONS | COMMON/ INDIVIDUAL | USER LEVEL (INDIVIDUAL) | | |
| | | | OPERATOR | PROGRAMMER | MANAGER/ MAINTENANCE PERSON |
| SAFETY COVER : OPEN | CONFIRM OPENING/CLOSING : TURN ON SWITCH | USER LEVELS | ○ | × | × |
| FEEDER BANK : MOVE DOWNWARD | FEEDER BANK SENSOR : ON | | ○ | × | × |
| FEEDER : FOREIGN MATTER DETECTION | FEEDER DETECTION SENSOR : ON | | ○ | ○ | × |
| EMERGENCY STOP | EMERGENCY STOP SWITCH : ON | COMMON | ○ | ○ | ○ |
| MOVE OUT OF RANGE | LIMIT SENSOR : ON | | ○ | ○ | ○ |
| ABNORMALITY IN FEEDBACK SYSTEM (EXCESSIVE RESIDUAL PULSES) | POSITIONAL DEVIATION | | ○ | ○ | ○ |
| | SPEED DEVIATION | | ○ | ○ | ○ |

Fig. 7

| INDIVIDUAL USER LEVEL | CONTROL SUBJECT/ CONFIRMATION SUBJECT | INTERRUPTION PHENOMENA (INTERRUPTION CAUSES) | | |
|---|---|---|---|---|
| | | SAFETY COVER OPEN | FEEDER BANK SENSOR | FEEDER DETECTION SENSOR |
| OPERATOR | STOP METHOD ID | ABRUPT DECELERATION AND STOP ACCORDING TO COMMAND | ABRUPT DECELERATION AND STOP ACCORDING TO COMMAND | ABRUPT DECELERATION AND STOP ACCORDING TO COMMAND |
| | MAIN CIRCUIT INTERRUPTION CONTROL | INTERRUPT AFTER STOP | INTERRUPT AFTER STOP | INTERRUPT AFTER STOP |
| | DETECTION OF FEEDER BANK DOWNWARD MOVEMENT | NO DETECTION | DETECTION POSSIBLE | |
| | FEEDER FOREIGN MATTER DETECTION | NO DETECTION | | DETECTION POSSIBLE |
| | SERVO AMPLIFIER PARAMETERS | NO CHANGE | NO CHANGE | NO CHANGE |
| PROGRAMMER | STOP METHOD ID | CHANGE SPEED TO ULTRA LOW SPEED | CHANGE SPEED TO ULTRA LOW SPEED | ABRUPT DECELERATION AND STOP ACCORDING TO COMMAND |
| | MAIN CIRCUIT INTERRUPTION CONTROL | NOT INTERRUPTED | NOT INTERRUPTED | INTERRUPT AFTER STOP |
| | DETECTION OF FEEDER BANK DOWNWARD MOVEMENT | NO DETECTION | NO DETECTION | |
| | FEEDER FOREIGN MATTER DETECTION | NO DETECTION | | DETECTION POSSIBLE |
| | SERVO AMPLIFIER PARAMETERS | CHANGE | CHANGE | NO CHANGE |
| MANAGER/ MAINTENANCE PERSON | STOP METHOD ID | CHANGE SPEED TO ULTRA LOW SPEED | CHANGE SPEED TO ULTRA LOW SPEED | CHANGE SPEED TO ULTRA LOW SPEED |
| | MAIN CIRCUIT INTERRUPTION CONTROL | NOT INTERRUPTED | NOT INTERRUPTED | NOT INTERRUPTED |
| | DETECTION OF FEEDER BANK DOWNWARD MOVEMENT | NO DETECTION | NO DETECTION | |
| | FEEDER FOREIGN MATTER DETECTION | NO DETECTION | | NO DETECTION |
| | SERVO AMPLIFIER PARAMETERS | CHANGE | CHANGE | CHANGE |

ELECTRONIC COMPONENT MOUNTING APPARATUS

FIELD OF THE INVENTION

The present invention relates to an electronic component mounting apparatus which has a safety cover for covering the movable range of a movable portion such as a head portion and can control the operation of the movable portion in accordance with the opening/closing of the safety cover.

DESCRIPTION OF RELATED ART

An electronic component mounting apparatus is configured in a manner that a head portion provided with a nozzle for picking a part up is moved to a corresponding position on a substrate by a servomotor and moves the nozzle in the up and down direction to thereby mount the picked-up part on the substrate.

The servomotor is subjected to the feedback control in accordance with a current position or a speed detected by an encoder or a linear scale in a manner of being driven by a servo amplifier at a designated speed so as to locate at a target position.

The feedback control is performed so as to render a difference between the target position and the current position zero while detecting a difference between an instruction pulse number representing the target position and a feedback pulse number representing the current position. The difference pulse number is called a residual pulse or a deviation pulse.

When a failure occurs in a control loop formed by the servo amplifier, the motor, a machine operation mechanism, a detector (encoder or linear scale etc.) etc. and the motor can not operate, the residual pulses are accumulated. Then, when the failure etc. is recovered and the motor can be operated, the motor may be driven at an abnormal high speed unexpectedly by the accumulated residual pulses, whereby there arises a risk that the head portion may be moved at an abnormal high speed. The control loop of the feedback control is also called as a feedback system, an F/B system or an F/B loop system etc.

Thus, the servo amplifier has a structure for monitoring the residual pulses and the positional deviation value or the speed deviation value based on a signal fed back from the detector and for braking.

In this case, it is required to suitably set a threshold value for determining an abnormality in the aforesaid monitoring.

For example, when the threshold value for monitoring the accumulation of the residual pulse is too small, although the number of the residual pulses accumulated inadvertently can be suppressed, it is determined to be abnormal even when the residual pulse is generated due to the follow-up delay at the time of the acceleration or deceleration in the normal operation. In contrast, in the case where the threshold value for monitoring the accumulation of the residual pulse is too large, when there arises an abnormality such as a contact failure or a trouble in the control loop, the determination of the abnormality delays due to the largeness of the threshold value. Thus, since many residual pulses are accumulated, the head portion moves dangerously at a high speed by an amount corresponding to the threshold value.

Therefore, in the electronic component mounting apparatus, a safety cover for covering the movable range of the head portion etc. is provided. The electronic component mounting apparatus detects the opening/closing of the safety cover. When the safety cover is opened, a main circuit power supply for supplying power to the servo amplifier and the motor is interrupted to thereby prevent the movement of the movable portion.

However, when the safety cover is opened, always the moving operation of the movable portion can not be performed. Thus, at the time of performing the maintenance work of the apparatus, since the status can not be confirmed while operating the apparatus, there arises a problem in the workability.

JP-A-2003-133800 provides a change-over switch for switching between an operation for giving priority to the safety ("mounting mode") and an operation for giving priority to the operability ("initial set-up mode") in accordance with a purpose.

In the case where the change-over switch is switched on the "mounting mode" side, when "the opening of a safety cover" is detected or "an area sensor" detects a foreign matter, the power supply for a driving portion (main circuit) is set to be interrupted to thereby give the priority to the safety.

On the other hand, in the case where the change-over switch is switched on the "initial set-up mode" side, when "the opening of the safety cover" is detected or "the area sensor" detects a foreign matter, such the detection is passed or neglected to thereby give the priority to the operability without interrupting the power supply.

As explained above, in JP-A-2003-133800, in the "initial set-up mode" in which the priority is given to the operability, the turn-on state of the power supply for the main circuit is continued even when the safety cover is opened. Thus, a head portion is driven at a high speed by residual pulses.

Further, in JP-A-2003-133800, since the mode can be changed irrespective of the working skill level of an operator, an operator required to originally select "the mounting mode" can easily change the mode erroneously into "the initial set-up mode" giving the priority to the operability over the safety. Thus, there may arise a dangerous case that an operator switches the mode into "the initial set-up mode" inadvertently as misunderstanding as "the mounting mode" to thereby use the apparatus in "the initial set-up mode".

SUMMARY OF INVENTION

The present invention provides an electronic component mounting apparatus which can improve the convenience of a work while surely securing the safety of a user.

According to an aspect of the invention, an electronic component mounting apparatus in which a nozzle provided at a head portion picks up a component from a feeder to move the nozzle to a corresponding position on a substrate to thereby mount the component thus picked up on the substrate, includes:

a means for accepting input of user level information relating to a degree of skill of a worker as to safety measures for treating the apparatus in advance before starting an operation of the electronic component mounting apparatus; and a means for interrupting or not interrupting a power supply of a mechanical portion operating the head portion, in accordance with the user level information and a state of the apparatus including at least one of an open state of a safety cover for covering a movable range of the head portion, a downward movement of a feeder bank and a detection of a feeder foreign matter.

BRIEF DESCRIPTION OF THE DRAWINGS

FIG. 6 is a diagram of the display screen showing a window for performing the machine setup in the exemplary embodiment.

FIG. 7 is a diagram showing an individual user level control table referred at a time of executing a software in the exemplary embodiment.

DETAILED DESCRIPTION OF EXEMPLARY EMBODIMENTS

Hereinafter, an exemplary embodiment of the invention will be explained in detail with reference to FIGS. 1 to 13.

First, an electronic component mounting apparatus according to the exemplary embodiment will be explained with reference to FIGS. 1 and 2.

Figure 1:
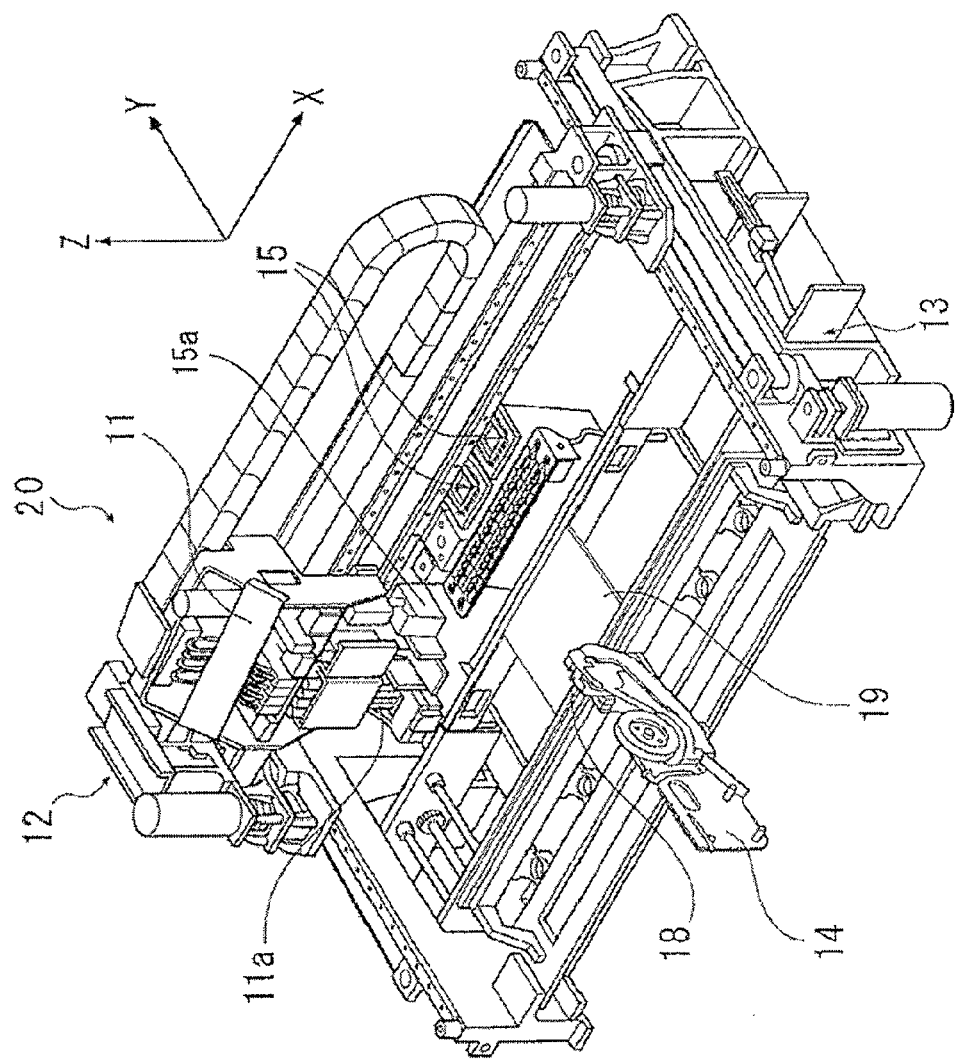
FIG. 1 is a perspective view seen from an inclined upper direction of an electronic component mounting apparatus according to an exemplary embodiment to which the invention is applied.

In the electric component mounting apparatus 20, a substrate 19 is disposed at the center and a feeder 14 is disposed at the left lower side in FIG. 1. In the feeder 14, the electric component suction nozzle 1 of a mounting head 11 sucks a chip component 3 at the position of a reference numeral 18. The mounting head 11 is provided with a plurality of, four in this exemplary embodiment, the electric component suction nozzles 1 and a plurality of, four in this exemplary embodiment, θ-axis driving mechanisms, each for rotating the electric component suction nozzle 1 in the θ-axis direction so as to be disposed in serial in the X-axis direction.

The mounting head 11 is moved in the X-axis direction by an X-axis mechanism portion 12 provided with an X-axis motor 21 and also moved in the Y-axis direction by a Y-axis mechanism portion 13 provided with a Y-axis motor 22. The mounting head 11 contains a Z-axis mechanism portion and a θ-axis mechanism portion. The mounting head 11 is moved in the Z-axis direction by the Z-axis mechanism portion provided with a Z-axis motor 23 and also moved in the θ-axis direction by the θ-axis driving mechanism provided with a θ-axis motor 24. The electric component suction nozzle 1 attached to the mounting head 11 sucks the chip component 3 by a vacuum mechanism 25 (FIG. 2).

A laser recognition device 34 (FIG. 2) for measuring the sectional length of the chip component 3 is attached to the mounting head 11. The chip component 3 is sucked by the electric component suction nozzle 1 in the particular direction orthogonal to the θ-axis.

The electric component mounting apparatus 20 is provided with a charge coupled device (CCD) camera 15 for imaging the chip component 3 sucked by the electric component suction nozzle 1 from the beneath direction and a CCD camera 15a for imaging a reference mark of the substrate from the upper direction. Each of the CCD cameras 15, 15a is provided with an illumination means for illuminating a subject to be imaged at the time of imaging.

Figure 2:
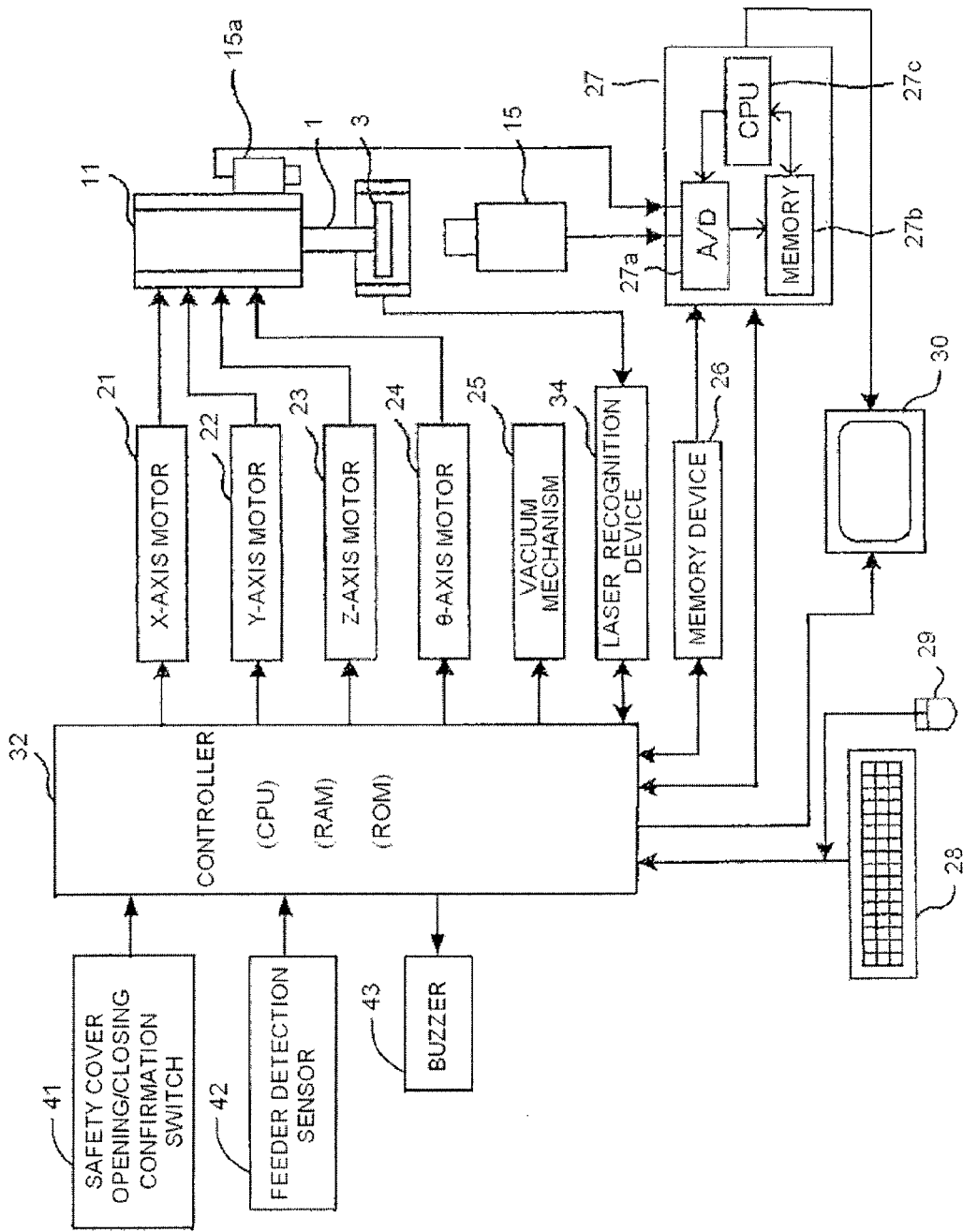
FIG. 2 is a block diagram showing the hardware configuration relating to control according to the exemplary embodiment.

As shown in FIG. 2, the CCD cameras 15, 15a are connected to an analog to digital (A/D) converter 27a contained in an image recognition device 27 having a central processing unit (CPU) 27c and a memory 27b. The image recognition device 27 constitutes a vision camera sensing system (VCS) for measuring the sizes and the center positions of the chip component 3 and the reference mark imaged by the CCD cameras 15, 15a and for measuring the rotation angle of the chip component 3 around the θ-axis. The image recognition device 27 receives a command from a controller 32 via a memory device 26.

The controller 32 contains a CPU, a random access memory (RAM) and a red only memory (ROM). The controller 32 is connected to a key board 28, a mouse 29, an image display device 30, a safety cover opening/closing confirmation switch 41, feeder detection sensors 42 and a buzzer 43. The image display device 30 is also connected to the image recognition device 27. The controller 32 is also connected to the X-axis motor 21, the Y-axis motor 22, the Z-axis motor 23, the θ-axis motor 24, the vacuum mechanism 25, the laser recognition device 34 and the memory device 26.

The safety cover opening/closing confirmation switch 41 is turned on and off in accordance with the opening and the closing of the safety cover covering the movable range of the head portion to thereby detect whether the safety cover is opened or closed.

The feeder detection sensors 42 contain five sensors in total, that is, two sensors for respectively detecting the floating states of two feeders on the front side, two sensors for respectively detecting the floating states of two feeders on the rear side and a sensor for detecting the stick portion of a feeder on the rear side. Each of these sensors detects whether or not the feeder is attached correctly and not in the floating state at the position where the feeder is attached in the feeder bank, in the state where the feeder bank is moved upward.

Such the feeder detection sensors 42 are used for detecting the intrusion of a part of a human body or a foreign matter into the main body of the electric component mounting apparatus 20 in the state where the feeder bank is moved downward or separated. The feeder detection sensor 42 is turned on at the time of detecting the intrusion of a part of a human body or a foreign matter.

When the opening of the safety cover is detected by the safety cover opening/closing confirmation switch 41 or the intrusion of a part of a human body or a foreign matter is detected by the feeder detection sensors 42, an interruption signal is generated with respect to a software program operated in the controller 32 as well as flowcharts shown in FIGS. 8 to 13.

Hereinafter the operation of the exemplary embodiment will be explained.

In the factory of a major company, workers called "operators" operate the machines in a production line. Since the operators only perform the operation of supplying components, they have little technical knowledge and sense of dangerous. On the other hand, at the time of the initial set-up working for changing the kind of the substrate to be produced, workers called "programmers" for preparing a production program and "managers" and "maintenance persons" (maintenance workers) for setting and adjusting the units of the electronic component mounting apparatus use the machine. The contents of the working differ among the workers of "operators", "programmers", "managers" and "maintenance persons" and so required knowledge, experience and operation contents also differs thereamong. The knowledge and experience of each worker is hereinafter also called skill.

Figure 3:
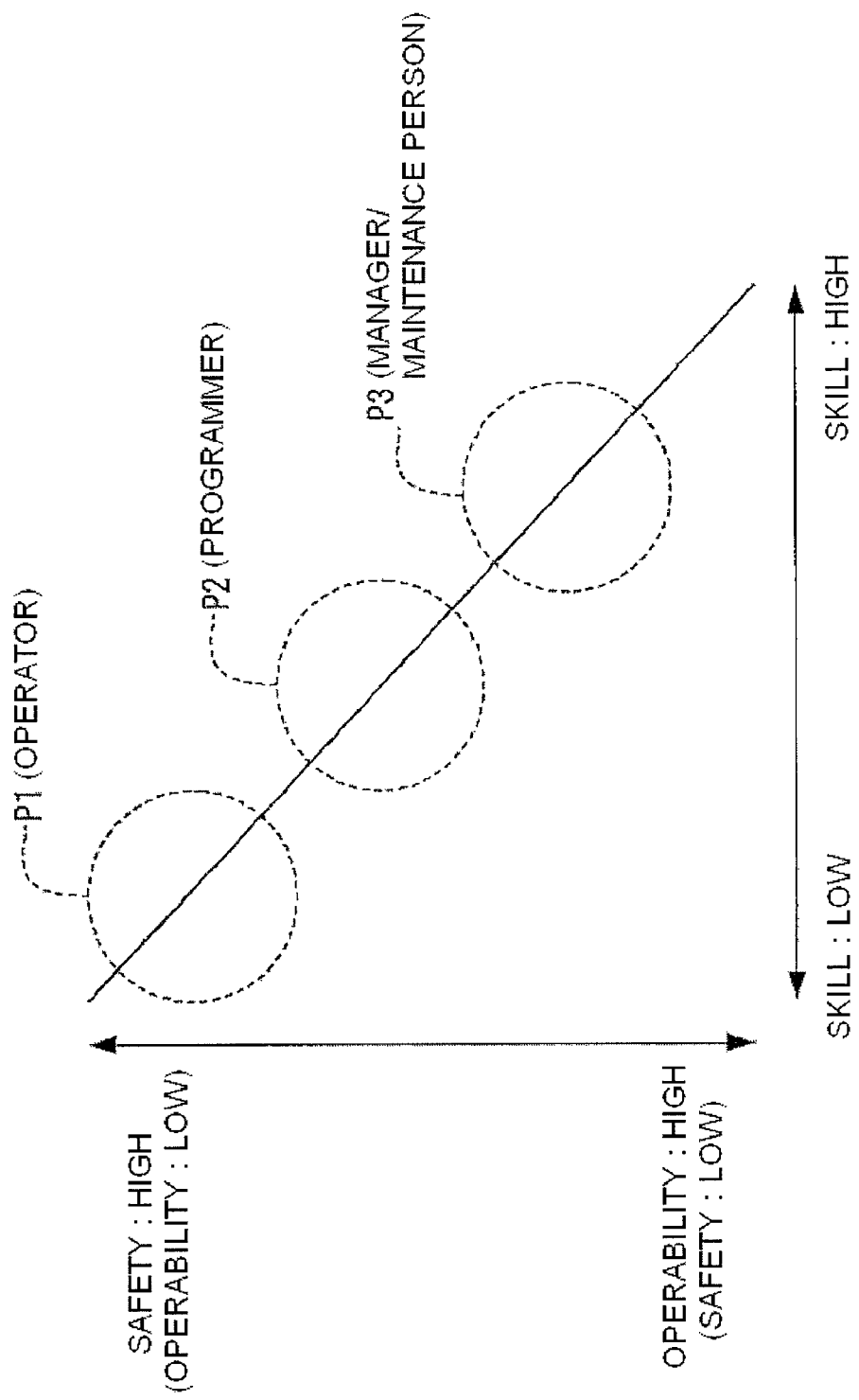
FIG. 3 is a schematic diagram showing the relation among operability, safety and skill with respect to "operator", "programmer" and "manager/maintenance person" according to the exemplary embodiment.

In FIG. 3, the "skill" represents the degree of knowledge and experience for treating the electronic component mounting apparatus so as not to cause a trouble in the safety of a worker and a trouble of the breakage of the apparatus. The higher the skill of a worker is, the worker can sufficiently concern with the safety of the worker and the breakage of the apparatus.

First, the work of the "operator" shown by a symbol P1 is mainly to supply the components. Thus, at the time of operating the electronic component mounting apparatus, the safety is required with the top priority. At the time of supplying the components in the electronic component mounting apparatus, usually it is not necessary to open the safety cover. Thus, at the time of the working of the operator, even when the safety state is set where the main circuit of a servo amplifier is interrupted and hence all the shafts can not be operated when the safety cover is opened, there arises no problem in the working efficiency.

Next, in the work of the "manager" and "maintenance person" shown by a symbol P3, since the safety cover is opened to thereby treat the inner portion of the machine and perform various settings, they are required to work in a manner of frequently inserting the body within the machine. Thus, when the main circuit is interrupted and the axial movement is inhibited each time the safety cover is opened, although the safety can be surely secured, it is required to restore in the state of capable of performing the axial movement at every interruption. As a result, the working efficiency is remarkably degraded.

In the work of the "programmer" shown by a symbol P2, although the frequency of working while inserting the body within the machine reduces, the safety cover is opened frequently. Thus, when the main circuit is interrupted each time the safety cover is opened, the working efficiency is also remarkably degraded.

One of the related arts discloses the technique that when the opening of a safety cover is detected, uniformly the head movement is stopped immediately and thereafter a main circuit is interrupted to thereby secure the safety. According to such the technique, although there arises no problem for the operator, the operability is degraded remarkably for the manager, the maintenance person and the programmer.

Like the technique disclosed in JP-A-2003-133800, it is considered simply that, for working while inserting the body within the machine, the power supply for the main circuit is not interrupted even when the safety cover is opened and the axial movement is performed at a low speed. However, in this case, it has been considered that if an abnormality occurs in the control loop of the axial movement, since the residual pulses are accumulated inadvertently, the head 11 moves at an abnormal high speed and so the safety can not be guaranteed.

In contrast, according to the exemplary embodiment, in order to exclude the risk caused inadvertently by such the abnormal high speed movement of the head 11 and to secure the safety, parameters for the servo control can be set flexibly.

When the safety cover is opened and the power supply for the main circuit is interrupted, in order to perform the succeeding workings, it is required to perform some workings and mechanical operations according to the contents of the succeeding workings.

Hereinafter, the explanation will be made as to an example of the workings and mechanical operations for performing the workings succeeding to the suction mounting operation in the case of opening the safety cover on the way of the suction mounting operation of the components in the production of the substrate.

A1) Before closing the safety cover, the substrate is disposed as it is or eliminated in accordance with the selection of A4).

A2) The safety cover is closed. Then, the power supply for the main circuit is turned on to thereby execute the operation of restoring to the start point.

A3) When the restoring operation to the start point is executed, the nozzle 1 of the head 11 is returned. In the case of continuing the working, the nozzle 1 thus returned is again attached to the head 11.

A4) In order to continue the suction mounting operation, a start switch is pushed to select the condition. That is, the selection is made between the mounting of the succeeding components on the substrate having been subjected to the suction mounting operation and the mounting of the components from the first on the newly transferred substrate.

A5) In the case of mounting the succeeding components on the substrate having been subjected to the suction mounting operation, an operation is selected in which the camera traces and confirms whether or not the components fall when the substrate is stopped suddenly due to the opening of the safety cover. After the confirmation, the succeeding components can be mounted.

According to the aforesaid technique disclosed in JP-A-2003-133800, anyone can switch the change-over switch for validating and invalidating a safety device detecting portion to the "initial set-up mode" (invalidation of the safety device detecting portion). Thus, the operator may invalidate the safety device detecting portion inadvertently.

In contrast, according to the exemplary embodiment, a password is required in order to change the user level relating to the safety setting which corresponds to the operation of the change-over switch. Thus, the safety protection is performed in a manner that an operator can not arbitrarily change the user level into the higher level without inputting the password.

Figure 4:
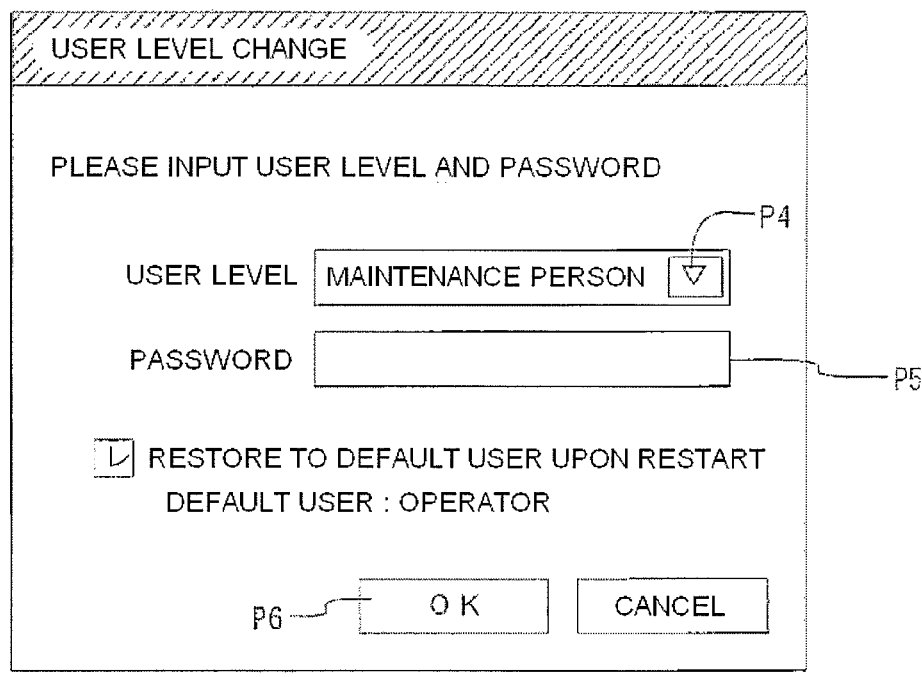
FIG. 4 is a diagram of a display screen showing a user level change window according to the exemplary embodiment.
Figure 5:
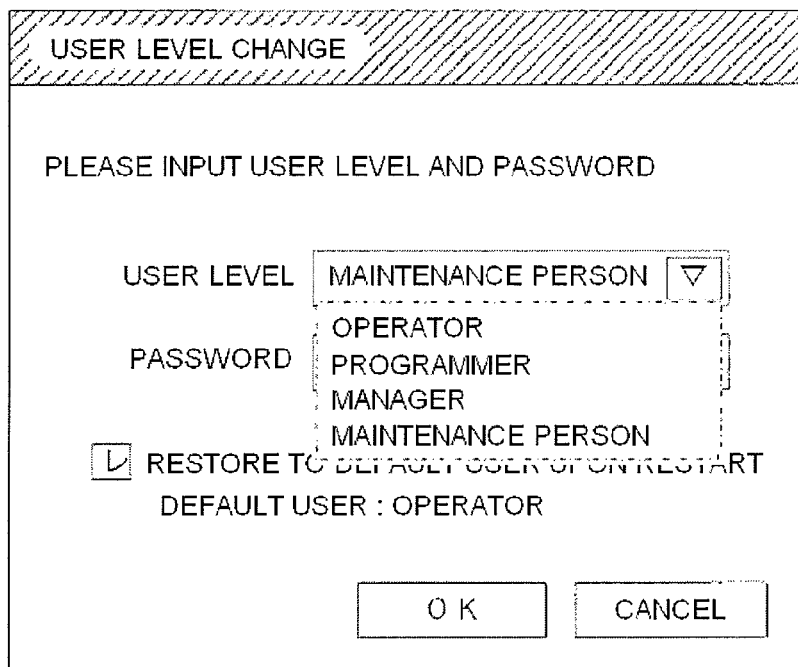
FIG. 5 is a diagram of the display screen showing the user level change window during the operation of changing the user level.

In FIG. 4, a symbol P4 is clicked by the mouse in order to change the user level. Then, as serially shown within a rectangle of an alternate long and short dash line in FIG. 5, a list of the user levels of "operator"-"programmer"-"manager"-"maintenance person" is displayed in a manner of a list box. Thus, the desired user level is selected from the list.

FIG. 4 shows a case where the "maintenance person" as a person for performing the maintenance service is selected. In order to finally set the user level thus selected, it is required to input the password set in advance with respect to the selected user level into the position of "password" shown by a symbol P5 and to click "OK" shown by a symbol P6 by the mouse.

The most simple and secure method for securing the safety is to interrupt the original power supply of a power line supplying the power to the motor from the power control portion of each of the servo amplifiers. In the exemplary embodiment, this method is represented by "main circuit interruption".

In FIG. 6, the left side shows the "causes for interrupting main circuit", and, more in detail, shows the concrete "conditions" with respect to the "main causes" respectively. In the exemplary embodiment, as shown on the right side in this figure, a symbol "○" representing the interruption of the main circuit or a symbol "x" representing the non-interruption of the main circuit is set with respect to each of the "conditions" in accordance with the "user division". First, the "user division" is briefly divided into two groups, that is, "individual user levels" and "common" in a column "common/individual".

The group of "individual user levels" includes three divisions of "operator", "programmer" and "manager/maintenance person", and the symbol "○" representing the interruption of the main circuit or the symbol "x" representing the non-interruption of the main circuit is set with respect to each of the user levels. In FIG. 6, with respect to the three main causes of "safety cover:open", "feeder bank:move downward" and "feeder:foreign matter detection", the symbol "○" representing the interruption of the main circuit is set to all the three main causes with respect to the "operator", the symbol "○" representing the interruption of the main circuit is set only to the "feeder:foreign matter detection" with respect to the "programmer", and the symbol "x" representing the non-interruption of the main circuit is set to all the three main causes with respect to the "manager/maintenance person".

The group of "individual user levels" is a group for detecting an opening space through which the body of a person can enter into the machine. The "feeder:foreign matter detection" of the exemplary embodiment is to detect a foreign matter in the opening space in which the feeder is attached, at the time of the "feeder bank:move downward", by using the feeder detection sensors 42 for detecting whether or not the feeder is attached correctly at the feeder bank as described above. That is, since the feeder can not be detected by the feeder detection sensors 42 during the "feeder bank:move downward", it is determined that the "feeder:foreign matter detection" is performed when the feeder detection sensors 42 detect the feeder at the time where the feeder bank sensor detects the "feeder bank:move downward".

Next, in another group "common" of the large division "common/individual", the symbols are not set individually with respect to the three user levels such as the "operator" and the symbol "○" representing the interruption of the main circuit is commonly set to the three user levels. This group "common" relates to a failure and an abnormality, for example, the "main circuit interruption" in synchronism with "movement:out of range (limit sensor:turn on)". In the group "common" of the exemplary embodiment, as a result, the symbol "○" representing the interruption of the main circuit is commonly set to all the "main causes" irrespective to the three divisions of the "operator", "programmer" and "manager/maintenance person".

A table shown in FIG. 7 is configured at every user level. In the left end column in FIG. 7, the operator level, the programmer level and the manager/maintenance person level are arranged from the top.

These operator level, programmer level and manager/maintenance person level are associated with information of an ID representing the kind of the stop method ("stop method ID"), a flag representing whether or not the main circuit interruption control is to be performed to interrupt the main circuit, a flag representing whether or not the detection of the feeder bank downward movement is to be performed, a flag representing whether or not the detection of the feeder foreign material is to be performed, and a flag representing whether or not the change of the servo amplifier parameters is to be performed. As described from the left end side at the top portion in FIG. 7, each of these information is set for respective interruption phenomenon of the opening of the safety cover, the feeder bank sensor for detecting the feeder bank downward movement, and the feeder detection sensor also used for detecting a foreign matter at the feeder.

In the electronic component mounting apparatus according to the exemplary embodiment, when the feeder bank to which a plurality of the feeders are attached moves upward, the feeder is located at a standby position where the nozzle 1 can suck the component. In contrast, when the feeder bank moves downward, the feeder is located at an evacuation position where the nozzle 1 can not suck the component and so can be detached from the electronic component mounting apparatus.

Hereinafter, the features of the exemplary embodiment will be listed and explained supplementarily.

B1) The main circuit interruption control differs at every user level. In the case of the user level such as the operator having a low skill, the safety is set to have the highest priority by interrupting the main circuit to place in a state where the shaft can not be moved. In contrast, in the case of the maintenance person or the manager having a high skill, the main circuit is not interrupted to place in a state where the shaft can be moved.

B2) In the case of a user having a high skill, the parameters are changed instead of interrupting the main circuit to thereby guarantee the safety while not interrupting the main circuit. In the case where the main circuit is maintained in the not-interrupted state, since it is not necessary to again perform the operation of restoring to the start point, the working efficiency can be improved.

In the aforesaid B1) and B2), in the case where the main circuit is not interrupted to place in the state where the shaft can be moved, it is arranged to move the shaft only at an ultra low speed.

However, in the exemplary embodiment, in the case of moving the shaft at the ultra low speed instead of interrupting the main circuit in view of the safety, another safety method is employed so as to enhance the safety. For example, by suitably changing the setting parameter for the servo control etc., even in the case where the head 11 in the moving state contacts with a foreign matter, it is possible to prevent the occurrence of such phenomena that a user is injured or the apparatus becomes failure due to an excessive torque and such the contact can be surely and quickly detected.

For example, in the case where the main circuit is kept in a state of not being interrupted irrespective of the presence or non-presence of the operation instruction, there may arise a case that the residual pulses are generated at the servo amplifier due to the failure or the contact failure of the control loop system. When the residual pulse is large, since a large current flows into the motor, there arises a quite dangerous phenomenon that the shaft moves at a speed higher than the command speed. Such the high-speed movement of the shaft may occur when the residual pulse is generated while not interrupting the main circuit, irrespective of the speed of the command. The parameter for detecting the failure or the contact failure of the control loop system resides in the servo amplifier, and the parameter relating to the threshold value for detecting the residual pulse is a positional deviation, a speed deviation etc.

In general, the threshold value for detecting these residual pulses is set to be larger than the residual pulse corresponding to a follow-up delay with respect to the command position generated at the time of acceleration or deceleration. When the threshold value is set to be small, the failure or the contact failure of the control loop system can be detected immediately. However, the threshold value can not be set to be small since the residual pulse corresponding to the follow-up delay at the time of acceleration is detected in the shaft movement in the normal state.

In contrast, according to the exemplary embodiment, since there is no follow-up delay while the shaft moves at the ultra low speed, the number of the residual pulses is quite small, so that there does not arise error during the movement even when the threshold value is set to be small. Further, since the threshold value is set to be small, it becomes possible to immediately detect the contact of a foreign matter with respect to the head 11 etc. in the moving state and the failure or the contact failure of the control loop system etc., whereby the safety can be guaranteed. The movement of the shaft at the ultra low speed is not intended to realize the safety by lowering the speed of the shaft but intended to satisfy the following relation.

Ultra low speed→no follow-up delay→no residual pulse→no error during movement→failure of control loop system etc. can be detected quickly B3) The feeder detection sensors include two kinds of sensors, that is, a sensor for detecting whether or not a feeder unit as a component supply apparatus is in a floating state and a sensor for detecting the presence or non-presence of the feeder. The original object of these sensors is to detect the feeder. In the exemplary embodiment, these sensors are also used as sensors for detecting the intrusion of a human body into the opening portion when the feeder bank moves downward.

B4) In the case where there is the safety cover on each of the front and rear sides of the machine, it is set to make only the switch for starting from the cover open side effective by utilizing the related art. In this respect, the operation can be always started from the side where the cover opens. When a plurality of persons for operating the machine work at the same machine, person's attention is attracted by sound or light since there is a case that a persons works while looking downward on the cover open side.

In an "individual user level control table" shown in FIG. 7, "detection possible" and "non detection" are set for each of the interruption phenomena of the feeder bank downward movement and the feeder detection sensor.

Hereinafter, an example of the concrete setting of the individual user level control table shown in FIG. 7 will be explained.

First, the following C1) to C3) relate to the setting of the "interruption phenomena" in FIG. 7 and the explanation will be made as to the setting to be incorporated during the processings shown in flowcharts of FIGS. 8 to 10.

C1) In the case of an interruption of the safety cover open: In this case, each of the detection of the feeder bank downward movement and the detection of a foreign matter by the feeder detection sensor is set to "non detection". This is because, when the interruption of the safety cover open is detected, it is necessary to execute the safety measures irrespective of the downward movement of the feeder bank or the detection by the feeder detection sensor. If an amount of the contents capable of being displayed is limited at the time of displaying the abnormal state, only the information about the opening of the safety cover may be displayed and other information, that is, the states of the feeder bank sensor (detection of the downward movement of the feeder bank) and the feeder detection sensor may not be displayed. As to the safety cover opening and the states of the feeder bank downward movement and the feeder detection sensor, the safety measures is realized by performing the logical addition operation of them.

C2) In the case of an interruption of the feeder bank sensor: The detection of the feeder bank downward movement is set as "detection possible" for the "operator", and as "no detection" for each of the "programmer" and the "manager/maintenance person". In the case of the operator, when the feeder change is performed inadvertently by moving the feeder bank downward during the operation of the mounting apparatus, there may arise a failure of the apparatus or the generation of a not-mounted component (failure of the substrate under the manufacturing). Thus, the feeder bank downward movement is set as the "detection possible" to thereby perform the main circuit interruption control etc. In contrast, in the case of the programmer and the manager/maintenance person, since there is a possibility that the feeder bank is moved downward intentionally in their work, the feeder bank downward movement is set as the "no detection" and the main circuit interruption control is not performed.

C3) In the case of an interruption of the feeder detection sensor 42: The feeder foreign matter detection is set as the "detection possible" for each of the "programmer" and the "operator" but set as the "no detection" for the "manager/maintenance person". That is, in the case of the operator and the programmer, since it is necessary to positively detect the intrusion of a human body etc. into the machine from the opening portion on the feeder bank side and to take the safety measures, the feeder foreign matter detection is set as "detection possible" to thereby perform the main circuit interruption control etc. In contrast, in the case of the manager/maintenance person, since there is a possibility of intentionally performing the intrusion operation from the opening portion on the feeder bank side in their work, the feeder foreign matter detection is set as "no detection" and the main circuit interruption control is not performed.

Figure 10:
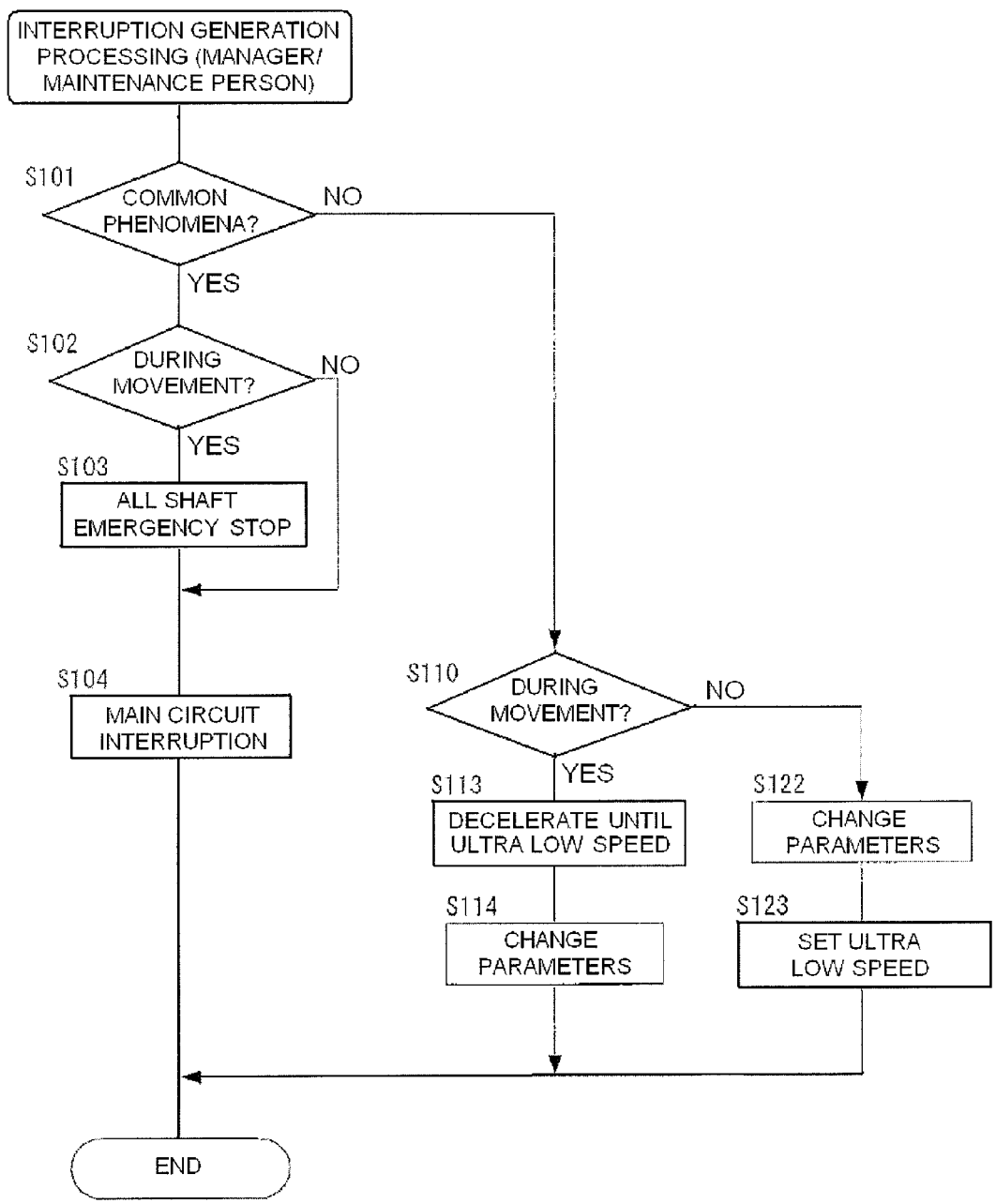
FIG. 10 is a flowchart showing an interruption generation processing according to the exemplary embodiment in a case where the user level is a manager/maintenance person.
Figure 11:
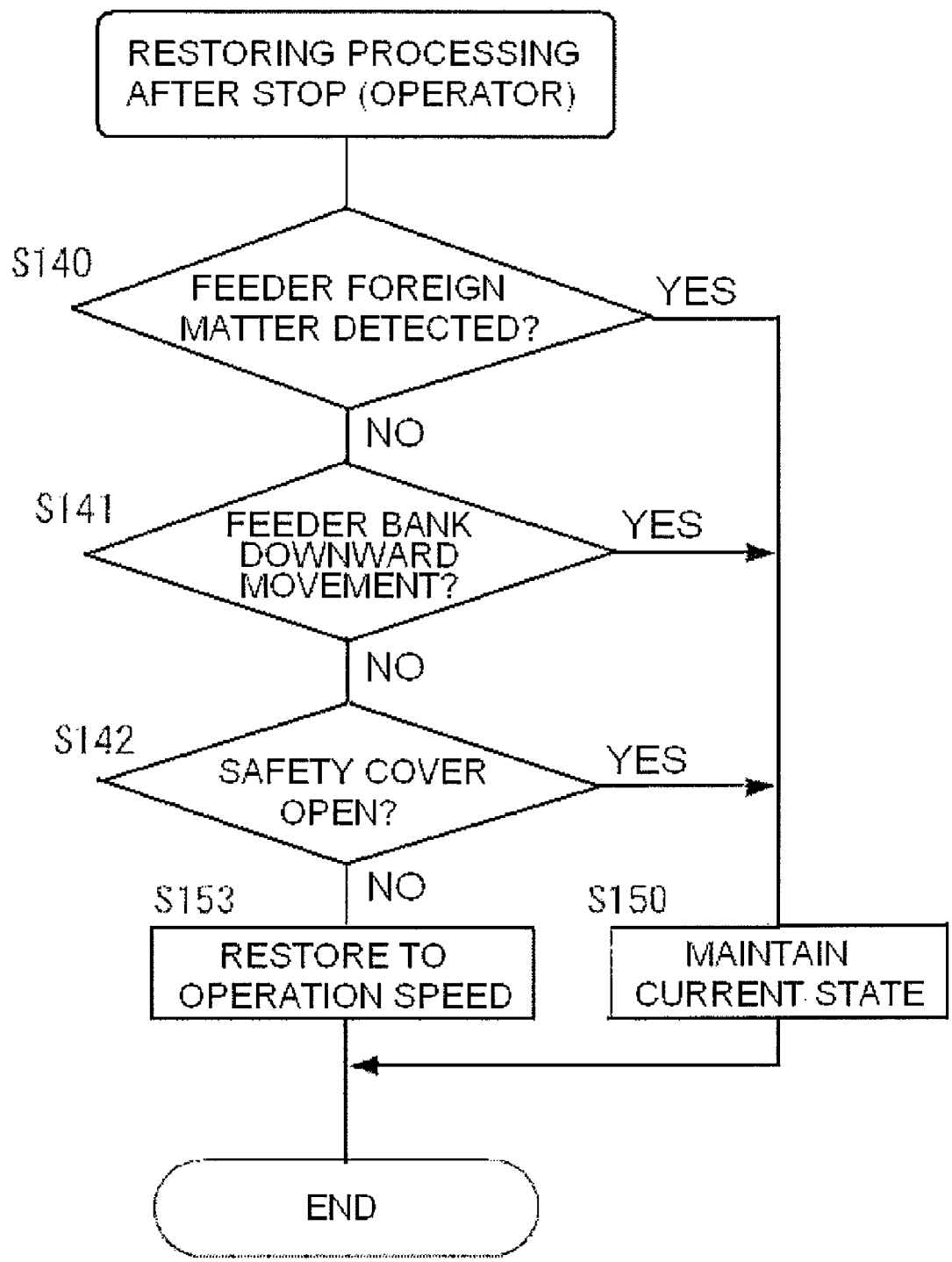
FIG. 11 is a flowchart showing a restoring processing after stop according to the exemplary embodiment in a case where the user level is an operator.
Figure 12:
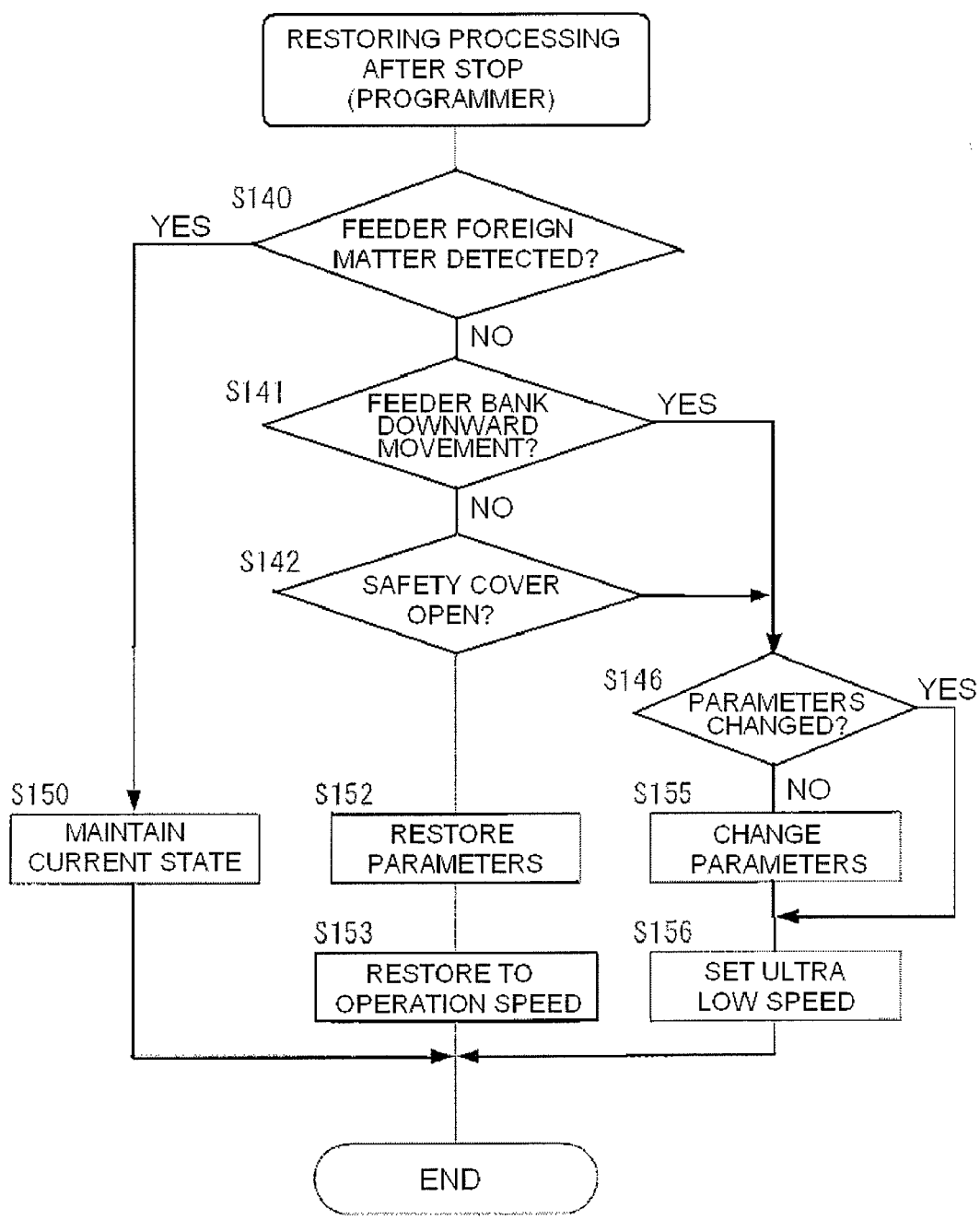
FIG. 12 is a flowchart showing a restoring processing after stop according to the exemplary embodiment in a case where the user level is a programmer.
Figure 13:
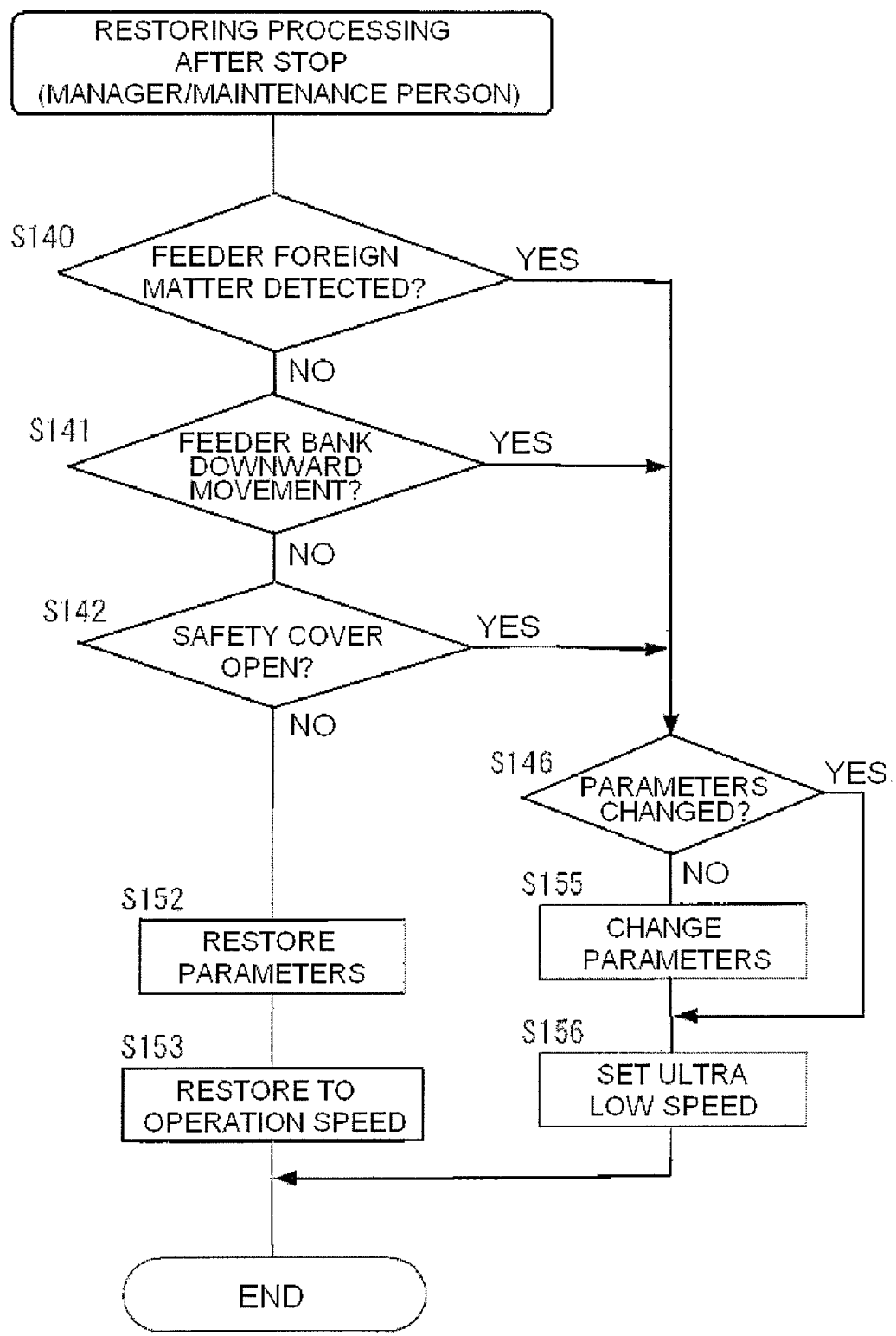
FIG. 13 is a flowchart showing a restoring processing after stop according to the exemplary embodiment in a case where the user level is a manager/maintenance person.

The individual user level control table shown in FIG. 7 can also be applied to "interruption generation processing" (flowcharts in FIGS. 8 to 10) and "restoring processing after stop" (flowcharts in FIGS. 11 to 13). Although the interruption processing of the "interruption generation processing" in FIGS. 8 to 10 is executed in the case of "during movement" and also "during stop", the processing before issuing a command by the "restoring processing after stop" in FIGS. 11 to 13 is executed only the "during stop" since it is to be performed before issuing the command.

Figure 8:
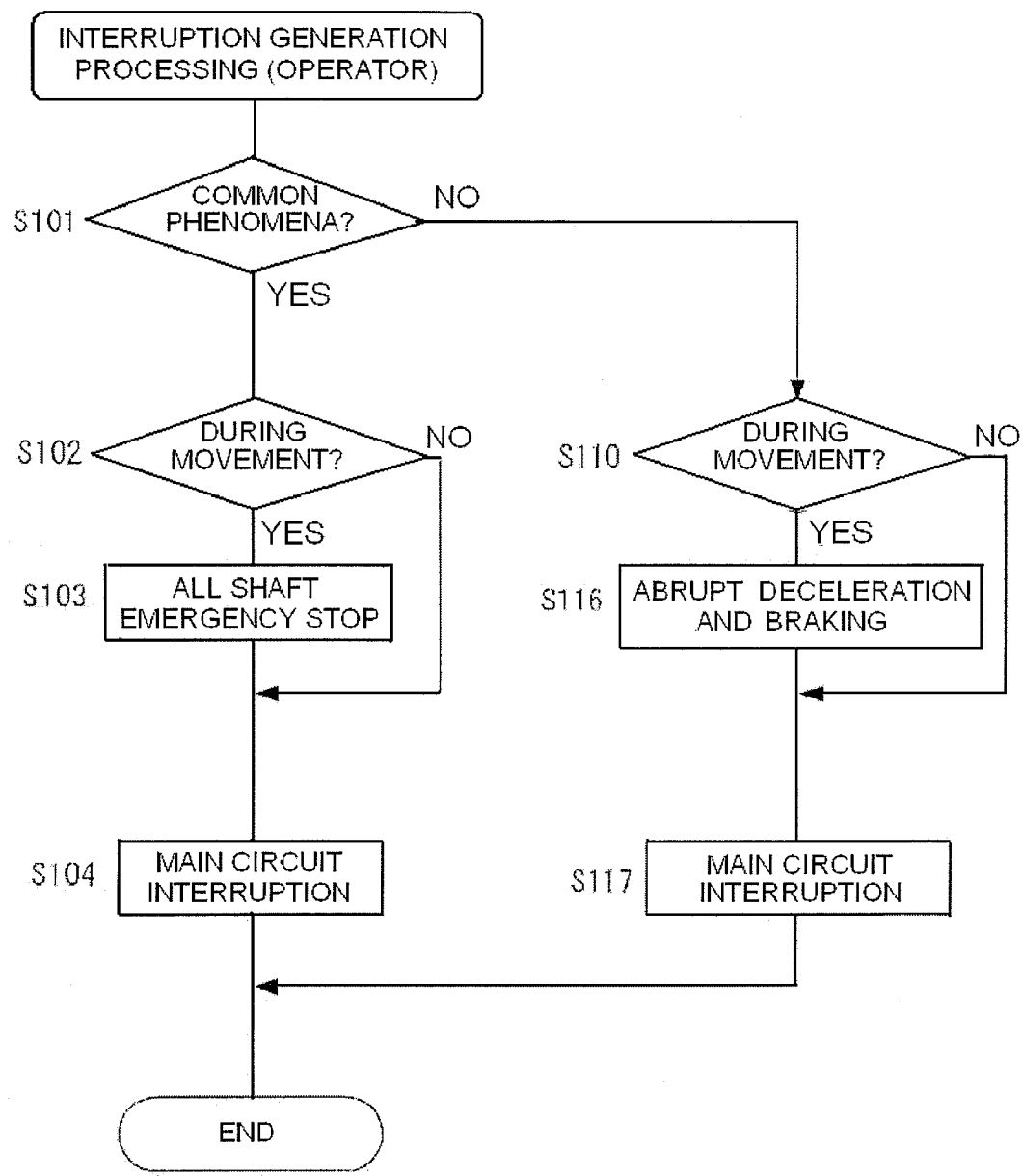
FIG. 8 is a flowchart showing an interruption generation processing according to the exemplary embodiment in a case where the user level is an operator.
Figure 9:
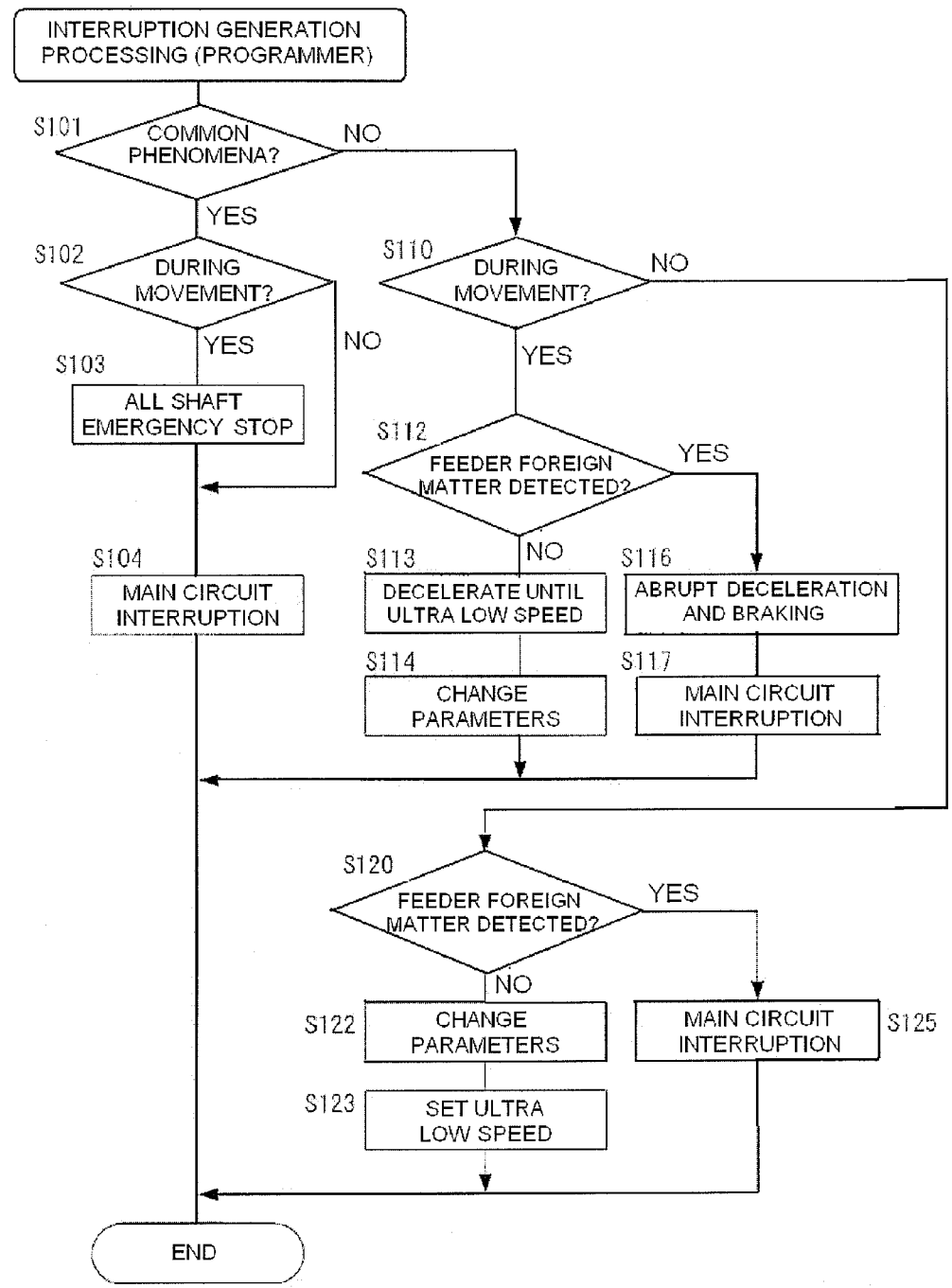
FIG. 9 is a flowchart showing an interruption generation processing according to the exemplary embodiment in a case where the user level is a programmer.

Thus, the "interruption generation processing" in FIGS. 8 to 10 is weighted on the stop method during the movement and so applied with the table of FIG. 7. In contrast, the "restoring processing after stop" in FIGS. 11 to 13 is weighted on two determinations, that is, whether or not a moving command is issued (movement is started or stop is maintained) in the case before issuing the moving command and whether or not, in the case of issuing the moving command, the parameter referred by the moving command is changed to set a low speed command capable of being moved by the parameter. In this determination, a part of the "detection possible" and the "no detection" in the individual user level control table shown in FIG. 7 is applied.

The operation of the exemplary embodiment will be explained by using the flowcharts.

First, FIGS. 8 to 10 show the interruption generation processings according to the exemplary embodiment in the case where the user level is the operator, the programmer and the manager/maintenance person, respectively.

Each of the interruption generation processing shown in FIGS. 8 to 10 and the restoring processing after stop shown in FIGS. 11 to 13 described later is executed and processed by the controller 32 of FIG. 2.

The emergency stop/main circuit interruption processing is a phenomenon generation interruption processing which execution is started by a hardware interruption generated by an input from one of various kinds of switches and detectors. The main phenomena generating the interruptions are the "safety cover:open", "feeder bank:move downward", "feeder:foreign matter detection", "emergency stop", "move out of range" and "abnormality in feedback system (including an abnormality detection in the control loop system and an abnormality of the servo amplifier)" shown in the column of the main causes in FIG. 6.

When an interruption is inputted, the processing is performed according to the control information such as the "stop method ID (an ID representing the kind of the stop method)", "main circuit interruption control (a flag representing whether or not the main circuit is to be interrupted)", "detection of feeder bank downward movement (a flag representing whether or not the feeder bank downward movement is to be detected)", based on the individual user level control table shown in FIG. 7 in accordance with the interruption cause and the current user level.

When the generation cause is the phenomenon belonging to the "common" in the column "common/individual" in FIG. 6, all the shafts are urgently stopped to thereby interrupt the main circuit in the case of the during the operation. In contrast, when the generation cause is the phenomenon belonging to the "individual user levels" in the column "common/individual", the stop control based on the stop method ID according to the individual user levels, the main circuit interruption control and the change of the parameters of the servo amplifier are performed in accordance with the respective information obtained from the table.

Respective steps of the flowcharts representing the interruption generation processings according to the exemplary embodiment shown in FIGS. 8 to 10 will be explained sequentially.

FIG. 8 is the flowchart showing the interruption generation processing according to the exemplary embodiment in the case where the user level is the operator.

In FIG. 8, first, the interruption cause is inspected in step S101. When the interruption cause is one of the "safety cover: open", "feeder bank:move downward" and "feeder:foreign matter detection", since the interruption cause belongs to the cause of the individual user levels, the process proceeds to step S110. In contrast, when the interruption cause belongs to the cause of the common, the process proceeds to step S102.

Next, in step S102, when the interruption is generated, it is determined whether or not the head 11 is moving. Step S103 is executed when the head 11 is moving, whilst step S104 is executed when the head 11 is in a stopped state.

In step S103, the head 11 is suddenly stopped by a dynamic brake, and other shafts are also suddenly decelerated and stopped by the dynamic brake or a command. In step S103, the method having the shortest stop distance is selected, while the stopping method is not limited to the particular one. In step S104, the power supply of the main circuit is interrupted to thereby interrupt the power supplies for the driving portions of all the servo amplifiers and the motor.

In contrast, when it is determined that the head is in the stopped state in step S102, the process proceeds to step S104, then the power supply of the main circuit is interrupted.

Next, in step S110, when the interruption is generated, it is determined whether or not the head 11 is moving. Step S116 is executed when the head is moving, while step S117 is executed when the head is in the stopped state.

In each of step S116 and step S117, the processing is performed according to the "stop method ID" in the table of FIG. 7. In step S116, the processing of the abrupt deceleration and the stop using the brake is performed in correspondence to the "abrupt deceleration and stop according to command" as the "stop method ID". Then, in step S117, the main circuit interruption control is performed.

When it is determined that the head is in the stopped state in step S110, the process proceeds to step S117, then the main circuit interruption control is performed.

The "stop method ID" in the exemplary embodiment includes two methods, that is, the "abrupt deceleration and stop according to command" and the "change speed to ultra low speed". In the processing of FIG. 8 in the case of the operator, the "stop method ID" only corresponds to the "abrupt deceleration and stop according to command".

In the exemplary embodiment, the stop processing such as the "abrupt deceleration and stop according to command" may be set as "stop by dynamic brake", "abrupt deceleration according to command" or "deceleration capable of being accelerated again".

Next, FIG. 9 is a flowchart showing the interruption generation processing according to the exemplary embodiment in the case where the user level is the programmer.

The respective steps in FIG. 9 will be explained sequentially. First, in step S101, the interruption cause is inspected. In the case where the interruption cause is the "safety cover: open", the "feeder bank:move downward" or the "feeder: foreign matter detection" in the column of the main causes shown in FIG. 6, the process proceeds to step S110 since the interruption cause is the cause of the individual user levels. In contrast, the process proceeds to step S102 when the interruption cause is the common cause.

Next, in step S102, when the interruption is generated, it is determined whether or not the head 11 is moving. Step S103 is executed when the head 11 is moving, while step S104 is executed when the head 11 is in the stopped state.

In step S103, the head 11 is suddenly stopped by the dynamic brake, and the other shafts are also suddenly decelerated and stopped by the dynamic brake or a command. In step S103, the method having the shortest stop distance is selected, while the stopping method is not limited to the particular one. In step S104, the power supply of the main circuit is interrupted to thereby interrupt the power supplies for the driving portions of all the servo amplifiers and the motor.

In contrast, when it is determined that the head is in the stopped state in step S102, the process proceeds to step S104, then the power supply of the main circuit is interrupted.

Next, in step S110, when the interruption is generated, it is determined whether or not the head 11 is moving. Step S112 is executed when the head is moving, while step S120 is executed when the head is in the stopped state.

In each of step S112 to step S117, the processing is performed according to the "stop method ID" in the table of FIG. 7.

When no foreign matter is detected in the "feeder foreign matter detection" in step S112, the deceleration processing is performed in step S113 in correspondence to the "change speed to ultra low speed" as the "stop method ID" to thereby reduce the current speed until the speed reduces to the ultra low speed. Then, in step S114, the parameters of the servo amplifier are changed.

When a foreign matter is detected in the "feeder foreign matter detection" in step S112, the processing of the abrupt deceleration and the stop using the brake is performed in step S116 in correspondence to the "abrupt deceleration and stop according to command" as the "stop method ID". Then, in step S117, the main circuit interruption control is performed.

When it is determined that the head is in the stopped state in step S110, it is determined whether or not a foreign matter is detected in the "feeder foreign matter detection" in step S120. When no foreign matter is detected in the "feeder foreign matter detection" in step S120, the parameters of the servo amplifier are changed in step S122. Then, the processing corresponding to the "change speed to ultra low speed" as the "stop method ID" is performed in step S123 to thereby set the mode to the ultra low speed operation described later relating to the restoring processing after stop. In contrast, when a foreign matter is detected in the "feeder foreign matter detection" in step S120, the main circuit interruption control is performed in step S125.

In step S114 and S122 etc. of the exemplary embodiment, the parameters of the servo amplifier are changed into the minimum value capable of immediately discriminating the residual pulse which is generated by the abnormality of the control loop system. Further, the threshold value for limiting the motor torque is changed into a threshold value for the ultra low speed movement to thereby guarantee the safety in duplicate. According to the exemplary embodiment, three kinds of parameters, that is, parameters relating to the two residual pulses of a positional deviation parameter and a speed deviation parameter and a parameter of a torque limit value for limiting the maximum current to be outputted to the motor are changed.

FIG. 10 is a flowchart showing the interruption generation processing according to the exemplary embodiment in the case where the user level is the manager/maintenance person.

The respective steps of FIG. 10 will be explained sequentially. First, in step S101, the interruption cause is inspected. In the case where the interruption cause is the "safety cover: open", the "feeder bank:move downward" or the "feeder: foreign matter detection" in the column of the main causes shown in FIG. 6, the process proceeds to step S110 since the interruption cause is the cause of the individual user levels. In contrast, the process proceeds to step S102 when the interruption cause is the common cause.

Next, in step S102, when the interruption is generated, it is determined whether or not the head 11 is moving. Step S103 is executed when the head 11 is moving, while step S104 is executed when the head 11 is in the stopped state.

In step S103, the head 11 is suddenly stopped by the dynamic brake, and the other shafts are also suddenly decelerated and stopped by the dynamic brake or a command. In step S103, the method having the shortest stop distance is selected, whilst the stopping method is not limited to the particular one. In step S104, the power supply of the main circuit is interrupted to thereby interrupt the power supplies for the driving portions of all the servo amplifiers and the motor.

In contrast, when it is determined that the head is in the stopped state in step S102, the process proceeds to step S104, then the power supply of the main circuit is interrupted.

Next, in step S110, when the interruption is generated, it is determined whether or not the head 11 is moving. Step S113 is executed when the head is moving, whilst step S122 is executed when the head is in the stopped state.

In each of step S113 and step S114, the processing is performed according to the "stop method ID" in the table of FIG. 7. In step S113, the deceleration processing is performed in correspondence to the "change speed to ultra low speed" as the "stop method ID" to thereby reduce the current speed until the speed reduces to the ultra low speed. Then, in step S114, the parameters of the servo amplifier are changed.

When it is determined that the head is in the stopped state in step S110, the parameters of the servo amplifier are changed in step S122. Then, the processing corresponding to the "change speed to ultra low speed" as the "stop method ID" is performed in step S123 to thereby set the mode to the ultra low speed operation described later relating to the restoring processing after stop.

Next, FIGS. 11 to 13 show flowcharts showing the restoring processings after stop in the exemplary embodiment in the case where the user level is the operator, the programmer and the manager/maintenance person, respectively.

The operation start processing shown in each of FIGS. 11 to 13 is a preprocessing in the case of moving the head 11. In these preprocessings, processings are performed before issuing the movement command according to the states relating to the sensors of the safety device such as the "safety cover: open", "feeder bank: move downward", "feeder:foreign matter detection" and also according to the individual user level control table shown in FIG. 7 based on the current user level. That is, the processing is performed according to the information of the setting of "stop method ID" as the control information in the table, the setting of "main circuit interruption control" as the flag representing whether or not the main circuit is to be interrupted, the flag representing whether or not the "detection of feeder bank downward movement" is to be performed, and the setting whether or not the "servo amplifier parameters" are to be changed.

When all the sensors of the safety device are in the off state, the head can be moved at a high speed. Thus, the mode is set so as to make the normal operation effective (normal operation mode). Alternatively, the parameter relating to the threshold value for detecting the residual pulse of the servo amplifier is restored to the original value for a high speed so that the head can be moved at the high speed.

On the other hand, when at least one of the sensors of the safety device is in the on state, the respective controls for the individual user levels are performed according to the respective information of the table. In the case of operating the head without interrupting the main circuit, the parameter relating to the threshold value for detecting the residual pulse of the servo amplifier is set to the minimum value so that the residual pulse due to the abnormality of the control loop system can be determined immediately. In this case, the mode is set so as to be movable only at the ultra low speed (ultra low speed operation mode). Alternatively, when at least one of the sensors of the safety device is in the on state and the main circuit is interrupted, the mode is set to "movement impossible".

In the restoring processings after stop shown in FIGS. 11 to 13, the determination of issuing/not-issuing the command of the moving operation and the determination of changing the speed/acceleration/deceleration into the ultra low speed are performed based on the mode thus determined in the aforesaid manner in a not-shown processing of issuing the next operation command.

Next, the respective steps of the restoring processings after stop in the exemplary embodiment shown in FIGS. 11 to 13 will be explained sequentially.

First, FIG. 11 is the flowchart showing the restoring processings after stop in this exemplary embodiment in the case where the user level is the operator.

In FIG. 11, first, the sensors relating to the safety device are inspected in step S140 to step S142. That is, the feeder foreign matter detection is determined by using the feeder bank sensor and the feeder detection sensor, the downward movement of the feeder bank is determined by using the feeder bank sensor, and the opening of the safety cover is determined by the safety cover open sensor. The process proceeds to step S153 when it is determined that none of these determinations exist, while the process proceeds to step S150 when it is determined that at least one of these determinations exists.

In step S150, the state of the apparatus and the parameters are maintained as they are and the processing is terminated.

In step S153, when the safety device for enabling the high speed movement is not operated, the mode to be outputted by this processing is set to "enabling normal high-speed movement" and the processing is terminated. When the mode is set to the "enabling normal high-speed movement", the maximum speed, the maximum acceleration and the maximum deceleration can be used.

The determination of the feeder foreign matter detection in step S140 is performed by checking whether or not the feeder detection sensor is in the on state under a state that the feeder bank moves downward. When the feeder detection sensor is in a state same as the feeder detection under the state that the feeder bank moves downward, there is a possibility that the feeder detection sensor detects a hand etc. of a worker entered into the opening portion.

Next, FIG. 12 is the flowchart showing the restoring processing after stop in this exemplary embodiment in the case where the user level is the programmer.

The respective steps of FIG. 12 will be explained sequentially. First, the sensors relating to the safety device are inspected in step S140 to step S142. That is, the feeder foreign matter detection is determined by using the feeder bank sensor and the feeder detection sensor, the downward movement of the feeder bank is determined by using the feeder bank sensor, and the opening of the safety cover is determined by the safety cover open sensor. The process proceeds to step S150 when it is determined that the feeder foreign matter is detected, while the process proceeds to step S146 when it is determined that the feeder bank moves downward or the safety cover is opened, and whilst the process proceeds to step S152 when it is determined that nothing is detected by these sensors.

First, when it is determined that the feeder foreign matter is detected, the state of the apparatus and the parameters are maintained as they are and the processing is terminated in step S150.

Alternatively, when it is determined that the feeder bank moves downward or the safety cover is opened, it is determined whether or not the setting parameter has been changed in step S146. That is, it is determined whether or not the setting parameter of the threshold value for monitoring the accumulation of the residual pulse has been changed into a small value so that the accumulation of the residual pulses due to the abnormality of the control loop system can be determined immediately. In the exemplary embodiment, the setting parameters are the parameters for the servo amplifier. The process proceeds to step S156 when the setting parameter has been changed, while the process proceeds to step S155 when the setting parameter has not been changed yet.

In step S155, various setting parameters are changed. For example, the setting parameter of the threshold value for monitoring the accumulation of the residual pulses in the servo amplifier is changed into the small value to thereby facilitate the detection of the abnormality. Further, the threshold value for limiting the torque of the motor is changed into a small value for the ultra low speed movement so that a large torque is not generated, to thereby guarantee the safety in duplicate. The three kinds of setting parameters in total, that is, the parameters relating to the two residual pulses of the positional deviation parameter and the speed deviation parameter and the parameter of the torque limit value for limiting the maximum current to be outputted to the motor are changed.

Succeeding to step S155, the mode to be outputted in this processing is set to "operable only at ultra low speed" in step S156. The ultra low speed means a speed at which the residual pulse due to the follow-up delay does not cause an excessive error of the residual pulse with respect to the parameter for monitoring the accumulation of the residual pulses set in step S155 at the time of the movement at the maximum speed, in an accelerated state or a decelerated state of the profile selected at the time of movement.

When it is determined that none of these determinations exist in steps S140 to S142, the parameter of the servo amplifier (threshold value capable of immediately determining the residual pulse due to the abnormality of the control loop system) is restored to the normal value in step S152 so as to be able to move at a high speed. In this case, the two parameters, that is, the positional deviation parameter and the speed deviation parameter are changed. Further, the limit of the torque is cancelled by the change of the parameters. In step S152, the setting parameter which value is changed in step S155 is restored to the original value.

In step S153, when the safety device for enabling the high speed movement is not operated, the mode to be outputted in the processing is set to the "enabling normal high-speed movement" and the processing is terminated. When the mode is set to the "enabling normal high-speed movement", the maximum speed state, the maximum acceleration state and the maximum deceleration state can be used.

The determination of the feeder foreign matter detection in step S140 is performed by checking whether or not the feeder detection sensor is in the on state under the state that the feeder bank moves downward. In the state that the feeder bank moves downward, there is a possibility that the feeder detection sensor becomes a on state due to a hand etc. of a worker entered into the opening portion.

Succeedingly, FIG. 13 is the flowchart showing the restoring processing after stop in this exemplary embodiment in the case where the user level is the manager/maintenance person.

The respective steps of FIG. 13 will be explained sequentially. First, the sensors relating to the safety device are inspected in step S140 to step S142. That is, the feeder foreign matter detection is determined by using the feeder bank sensor and the feeder detection sensor, the downward movement of the feeder bank is determined by using the feeder bank sensor, and the opening of the safety cover is determined by the safety cover open sensor. The process proceeds to step S152 when it is determined that none of these determinations exist, while the process proceeds to step S146 when it is determined that at least one of these determinations exists.

First, in step S146, it is determined whether or not the setting parameter has been changed. That is, it is determined whether or not the setting parameter of the threshold value for monitoring the accumulation of the residual pulse has been changed into a small value so that the accumulation of the residual pulses due to the abnormality of the control loop system can be determined immediately. In the exemplary embodiment, the setting parameters are the parameters for the servo amplifier. The process proceeds to step S156 when the setting parameter has been changed, while the process proceeds to step S155 when the setting parameter has not been changed yet.

In step S155, various setting parameters are changed. For example, the setting parameter of the threshold value for monitoring the accumulation of the residual pulses in the servo amplifier is changed into the small value to thereby facilitate the detection of the abnormality. Further, the threshold value for limiting the torque of the motor is changed into a small value for the ultra low speed movement so that a large torque is not generated, to thereby guarantee the safety in duplicate. The three kinds of setting parameters in total, that is, the parameters relating to the two residual pulses of the positional deviation parameter and the speed deviation parameter and the parameter of the torque limit value for limiting the maximum current to be outputted to the motor are changed.

Succeeding to step S155, the mode to be outputted in this processing is set to "operable only at ultra low speed" in step S156. The ultra low speed means a speed at which the residual pulse due to the follow-up delay does not cause an excessive error of the residual pulse with respect to the parameter for monitoring the accumulation of the residual pulses set in step S155 at the time of the movement at the maximum speed, in an accelerated state or a decelerated state of the profile selected at the time of movement.

When it is determined that none of these determinations exist in steps S140 to S142, the parameter of the servo amplifier (threshold value capable of immediately determining the residual pulse due to the abnormality of the control loop system) is restored to the normal value in step S152 so as to be able to move at a high speed. In this case, the two parameters, that is, the positional deviation parameter and the speed deviation parameter are changed. Further, the limit of the torque is cancelled by the change of the parameters. In step S152, the setting parameter which value is changed in step S155 is restored to the original value.

In step S153, when the safety device for enabling the high speed movement is not operated, the mode to be outputted in the processing is set to the "enabling normal high-speed movement" and the processing is terminated. When the mode is set to the "enabling normal high-speed movement", the maximum speed state, the maximum acceleration state and the maximum deceleration state can be used.

As explained above, according to the exemplary embodiment, before a user starts the operation, since the user level information as to the safety measures for treating the apparatus relating to the degree of skill of the user can be inputted together with a password, for example, the degree of the skill of the user can be surely set to the apparatus. Further, according to such the setting, the power supply of the mechanical portion operating the head portion can be set so as to be interrupted or not to be interrupted, in accordance with the state of the apparatus at least including the open/close state of the safety cover for covering the movable range of the head portion. Thus, the utility of the work can be enhanced while surely securing the safety of a user who engages various works and uses the apparatus.

Further, according to the exemplary embodiment, when a user is the operator, the user can operate the apparatus and secure the safety as in the past. In the case where a user is the programmer or the manager/maintenance person, when the safety cover is opened, the safety can be secured even if the main circuit is not interrupted since the operation similar to the main circuit interruption such as the suppression of the torque of the respective shafts is performed. Further, since the main circuit is not interrupted in the opening state of the safety cover, it is not necessary to perform again such the work of the restoration to the origin at the time of closing the safety cover, whereby the workability can be improved remarkably.

In the exemplary embodiment described above, the setting contents of the tables shown in FIGS. 6 and 7 is incorporated in the processing program itself shown in the flowcharts of FIGS. 8 to 13. In contrast, such the setting contents of the tables may not be incorporated in the program itself but the setting contents may be arranged to be reflected occasionally during the execution of the program while reading the corresponding portion of the setting contents of the tables shown in FIGS. 6 and 7. In this case, even in the case of changing the setting contents of the tables shown in FIGS. 6 and 7, since it is not necessary to change the program itself, the apparatus can cope with the change of the setting contents flexibly and quickly.

The setting contents of the tables shown in FIGS. 6 and 7 and the processing contents shown in the flowcharts in FIGS. 8 to 13 represent an example of the exemplary embodiment and the details thereof may be changed in various manners, for example.

For example, in the processings shown in FIGS. 8 to 13, except for the opening of the safety cover, a part of the determinations of the feeder foreign matter detection and the feeder bank downward movement may be eliminated.

What is claimed is:

1. An electric component mounting apparatus in which a nozzle provided at a head portion picks up a component from a feeder to move the nozzle to a corresponding position on a substrate to thereby mount the component thus picked up on the substrate, comprising:
   an input unit which accepts input of user level information relating to a degree of skill of a worker as to safety measures for operating the apparatus, in advance of starting an operation of the electronic component mounting apparatus; and
   a control unit which performs an on-off control of a power supply of a mechanical portion operating the head portion in accordance with the user level information and a state of the apparatus including at least one of an open state of a safety cover for cover covering a movable range of the head portion, a downward movement of a feeder bank and a detection of a feeder foreign matter,
   wherein at a time of operating the head portion by a servo positioning mechanism in a state that the safety cover is opened, at least one of setting parameters used for servo control of the servo positioning mechanism is set in accordance with the user level information, and wherein the setting parameters include a setting parameter of a threshold value for monitoring accumulation of residual pulses, a setting parameter of a moving speed, a setting parameter for determining an error with respect to a target value of one of a position, a speed and a torque, and a setting parameter of a torque limit value.

2. The electronic component mounting apparatus according to claim 1, wherein at the time of moving the head portion by the servo positioning mechanism in the state that the safety cover is opened, the setting parameter of the threshold value for monitoring accumulation of residual pulses is set to a small value to thereby move the head portion in this state at such a low speed that the threshold value is set so as not to accumulate the residual pulses determined to be abnormal in the monitoring.

* * * * *